United States Patent [19]

Saddler

[11] 3,735,209

[45] May 22, 1973

[54] SEMICONDUCTOR DEVICE PACKAGE WITH ENERGY ABSORBING LAYER

[75] Inventor: Ivan R. Saddler, Scottsdale, Ariz.

[73] Assignee: Motorola, Inc., Franklin Park, Ill.

[22] Filed: Feb. 10, 1972

[21] Appl. No.: 225,043

[52] U.S. Cl..........317/234 R, 317/234 A, 317/234 E, 317/234 G, 317/234 H, 174/52 S

[51] Int. Cl...............................H01l 3/00, H01l 5/00

[58] Field of Search.......................317/234, 1, 3, 3.1, 317/4, 4.1; 174/52 FP, DIG. 3

[56] References Cited

UNITED STATES PATENTS

| | | | |
|---|---|---|---|
| 2,857,560 | 10/1958 | Schnable et al. | 317/234 |
| 2,967,984 | 1/1961 | Jamison | 317/234 |
| 3,292,050 | 12/1966 | Grossoehme | 317/234 |
| 3,429,788 | 2/1969 | Parstorfer | 317/234 |
| 3,474,307 | 10/1969 | Ohashi et al. | 317/234 |
| 3,483,440 | 12/1969 | Dulin | 317/234 |
| 3,564,109 | 2/1971 | Ruechardt | 317/234 |
| 3,610,870 | 10/1971 | Sakamoto | 317/234 |

*Primary Examiner*—John W. Huckert
*Assistant Examiner*—Andrew J. James
*Attorney*—Vincent Rauner and Henry Olsen et al.

[57] ABSTRACT

There is disclosed a semiconductor device comprising a body of semiconductor material having at least one region of P conductivity type and a second region of N conductivity type defining a P-N junction therebetween. The body is bonded to a header having electrically isolated terminals extending therefrom. A lead wire is bonded to at least one of said conductivity regions and to one of said terminals. A closure member is secured to said header and the closure member and the header are surrounded by an energy absorbing layer of high atomic number particle impregnated resilient material. The particles have a diameter of between 0.25 and 1.0 mil and are approximately 50 percent by volume of said layer. The resilient material is preferably a highly plastisized polyvinyl chloride and the high atomic number particles are preferably tungsten carbide.

5 Claims, 1 Drawing Figure

Patented May 22, 1973 3,735,209
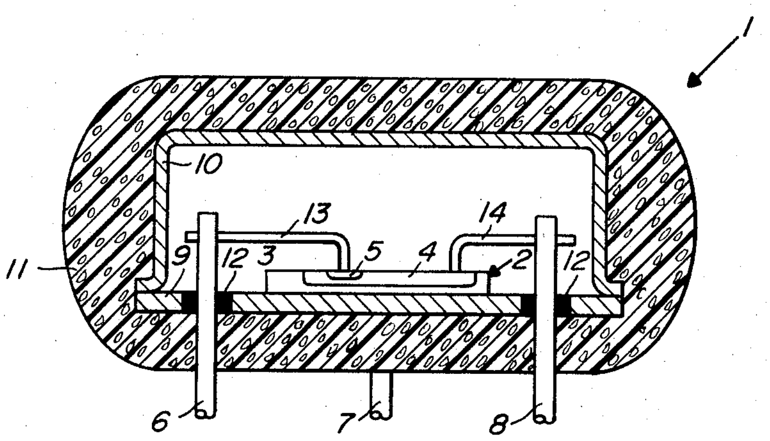

SEMICONDUCTOR DEVICE PACKAGE WITH ENERGY ABSORBING LAYER

BACKGROUND OF THE INVENTION

This invention relates to semiconductor devices generally, and more particularly to semiconductor devices having packages protecting said devices against the attack of vibratory or acoustic energy.

Heretofore, various semiconductor devices, such as transistors, having P conductivity regions and N conductivity regions forming P-N junctions therebetween have been protected from vibrational or acoustic energy by enclosing them in a housing. In a standard type of packaging the semiconductor device is mounted on a header having terminals extending therethrough in an insulative manner which terminals are electrically connected to the semiconductor by at least one lead wire. The lead wires are bonded to the electrodes of the transistors and to the terminals, the terminals thereby forming electrical connections for the transistor to the outside world. Typically such a header is completed by a closure member of metal or similar material which is welded or soldered to the header. In another type of package the semiconductor device and/or the header is completely surrounded by a compound which is moulded or potted therearound to form the closure protecting the semiconductor device. In another example of an enclosure, such as shown in U.S. Pat. No. 2,906,931, shock absorbing material is utilized to fill the inside of the metal enclosure to protect the semiconductor device from various vibratory or acoustic energy shocks. However, in the instance of the single metal can, the closure member surrounding the semiconductor device still permits certain wave lengths of acoustic energy to penetrate the package and preferentially cause disruption of the electrical circuit to the device. This phenomena is particularly acute where the lead wires to the electrodes and/or the bonding material bonding the semiconductor die to the header includes a high atomic number metal such as gold which appears to be preferentially disrupted by a particular acoustic energy. In the instance of a potting compound filling the interior of the metal housing such a construction is unsatisfactory in that it is difficult to handle and the energy may still be disruptive by being transferred directly to the semiconductor device from the potting material.

BRIEF DESCRIPTION

Accordingly it is a primary object of this invention to provide a package for a semiconductor device which includes means for absorbing acoustic energy to prevent its disruption of the operation of the semiconductor device.

A further object of the invention is to provide a semiconductor device which is enclosed in a package including an energy absorbing layer of material to prevent disruption of the semiconductor device by acoustic or vibrational energy.

In accordance with a further object of the invention the energy absorbing layer of material is preferably impregnated with an insulative material of a high atomic number metal which preferentially absorbs acoustic wave lengths in approximately the same manner as gold material.

In accordance with these objects there is provided a semiconductor package comprising a header having terminals extending therefrom to the exterior and to the interior of the package. A closure member is secured to said header and said closure member and being completely surrounded by an energy absorbing layer of high atomic number particle impregnated resilient material, said particles having a diameter of 0.25 to 1.0 mil and being approximately 50 percent by volume of said layer.

THE DRAWING

Further objects and advantages of the invention will be apparent to one skilled in the art from the following complete specification and the drawing wherein the FIGURE is a cross section of a semiconductor device in accordance with the preferred embodiment of the invention.

COMPLETE DESCRIPTION

As shown in the FIGURE, a semiconductor device 1 comprises a semiconductor chip 2, which chip has P and N doped semiconductor regions therein defining PN junctions and providing, for example, a collector, base and emitter region 3, 4 and 5. The semiconductor chip, or die, 2 is completely enclosed in an acoustic energy absorbing housing or package which includes terminals 6, 7, and 8 for electrical connection to the outside world. The terminals are insulatively sealed through the housing. The housing includes a header 9, a closure member 10 hermetically sealed to the housing and a resilient energy absorbing layer 11 completely surrounding the closure 10, the header 9, and portions of the terminals 6, 7 and 8. The header 9, preferably being of metallic conductive material, is insulated from terminals 6 and 8 by a insulative sealing means 12. The emitter 5 and base 4 of the transistor are respectively connected to the terminals 6 and 8 by lead wires 13 and 14. The transistor chip or die too is bonded to the header 9 and the terminal 7 is electrically connected to the header 9 to provide electrical connection to the collector 3 of the transistor.

It will be thus noted that the semiconductor packaging means comprises a comparatively standard package of the TO–18 type completely surrounded by the energy absorbing resilient material layer 11 which serves to protect the semiconductor die or chip 2 from damage from harmful acoustic or vibratory energies. This relatively standard package may be assembled in conventional manner and then the energy absorbing layer 11 applied by standard dipping, potting or molding methods. The transistor chip 2 is normally bonded to the header 9 by a gold or gold alloy material and the lead wires 13 and 14 are normally of gold. It appears that certain acoustic energies to which the closure member 10 and the header 9 are comparatively transparent preferentially disrupt the bond between the gold lead wires 13 and 14 and the bonding of the die to the header 9. The energy absorbing resilient layer 11 therefore includes particles of an insulative material having a high atomic number, i.e., at least an atomic number greater than 60, metal to preferentially absorb in the resilient energy absorbing layer those energies which would normally attack the die and wire bonds to the semiconductor chip 2. Preferably the material for this purpose has a high density, i.e., greater than 12, and a relatively low electrical conductivity so as to not effect shorting between terminals 6, 7 and 8. In order to prevent "windows" through the energy absorbing layer 11, while keeping the thickness of the energy absorbing layer within reasonable bounds, the particle size is of the order of 0.25 to 1.0 mils and the particles comprise approximately 50 percent by volume of the energy absorbing layer. The energy absorbing layer is about 20 mils thick on the average so that there is a probability of a window through the energy absorbing layer is approximately $10^{-6}$. The particles are embedded in a plastic or resin material having a relatively high damping factor so that the energy absorbed by the high atomic member, high density particles are transferred to the energy absorbing layer and not to the semiconductor chip. The plastic or resin material is a polymeric material which is highly plastisized by a relatively large percentage of high molecular weight solvents which remain after curing and thus, is relatively resilient. in accordance with one particular example of the invention the resilient layer 11 comprised 0.5 mil particles of tungsten carbide suspended in a resilient highly plastisized polyvinyl chloride approximately 20 mils thick. The tungsten carbide comprised approximately 50 percent by volume of the layer. Therefore, it can be calculated that statistically there are approximately 40 layers of ½ mil diameter particles in the energy absorbing layer. The probability that all 40 layers have no particle over the same "window" is $2^{-40}$ or about $10^{-12}$. Since there are about 0.2 square inches of area surrounding the semiconductor chip there are approximately $10^6$ ½ mil square spots surrounding the chip. Therefore, the probability that there is a window through which an energy ray may pass is approximately $10^{-6}$. Damage by a non interrupted ray is further made more improbable by the fact that the ray must, to cause damage, hit a sensitive area, i.e., either a die or wire bond.

It will thus be seen that there is provided a semiconductor device having a highly efficient acoustic or vibratory energy absorbing package surrounding it which will protect it from inadvertent damage. While the invention has been disclosed by way of the preferred embodiment thereof, it will be understood that suitable modifications may be made therein without departing from the spirit and scope of the invention.

What is claimed is:

1. A semiconductor device comprising a body of semiconductor material having at least one region of P conductivity and a second region of N conductivity type defining a P-N junction therebetween, said body being bonded to a header having electrically isolated terminals extending therefrom, a lead wire bonded at least to one of said conductivity regions and to one of said terminals and a closure member secured to said header, said closure member surrounded by an energy absorbing layer of high atomic number particles impregnated resilient matrix material said particles having a diameter of 0.25 to 1.0 mil and being approximately 50 percent by volume of said layer.

2. A semiconductor device as recited in claim 1 wherein said particles are tungsten carbide.

3. A semiconductor device as recited in claim 2 wherein said particles have an atomic number greater than 60 and a density greater than 12.

4. A semiconductor device as recited in claim 3 wherein said resilient matrix material is a highly plastisized polyvinyl chloride.

5. A semiconductor device as recited in claim 4 wherein said particles are tungsten carbide.

* * * * *